(12) United States Patent
Chen et al.

(10) Patent No.: US 9,094,034 B2
(45) Date of Patent: Jul. 28, 2015

(54) DIGITAL TO ANALOG CONVERTING SYSTEM AND DIGITAL TO ANALOG CONVERTING METHOD

(71) Applicant: MEDIATEK INC., Hsin-Chu (TW)

(72) Inventors: Sheng-Hao Chen, Hsinchu (TW); Yen-Chuan Huang, Hsinchu County (TW); Min-Hua Wu, Taipei (TW); Chun-Hao Liao, Taichung (TW); Hung-Pin Ma, Hsinchu County (TW); Tzu-Hao Yu, Taipei (TW); Jen-Che Tsai, Taichung (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/483,137

(22) Filed: Sep. 10, 2014

(65) Prior Publication Data

US 2015/0123830 A1    May 7, 2015

Related U.S. Application Data

(60) Provisional application No. 61/901,385, filed on Nov. 7, 2013.

(51) Int. Cl.
*H03M 1/66* (2006.01)
*H03M 1/06* (2006.01)
*H03M 1/74* (2006.01)

(52) U.S. Cl.
CPC ............. *H03M 1/0626* (2013.01); *H03M 1/74* (2013.01)

(58) Field of Classification Search
CPC ........ G09G 3/3648; G06F 1/04; H04H 20/48; H03L 7/113; H03M 1/1225; H03M 1/50; H03M 1/46; H03M 1/162; H03M 1/0663; H04L 7/0029
USPC .................. 341/144–165; 327/108, 291, 156; 375/362, 376; 370/359, 419
See application file for complete search history.

(56) References Cited

U.S. PATENT DOCUMENTS

| | | | |
|---|---|---|---|
| 6,043,697 A * | 3/2000 | Jang | 327/299 |
| 6,930,625 B1 * | 8/2005 | Lin | 341/143 |
| 6,947,514 B1 * | 9/2005 | Kato et al. | 375/376 |
| 7,081,841 B1 * | 7/2006 | Feist et al. | 341/120 |
| 2006/0136620 A1 * | 6/2006 | Chou | 710/58 |
| 2006/0244504 A1 * | 11/2006 | Kawabe | 327/291 |
| 2006/0279448 A1 * | 12/2006 | Lu | 341/161 |

* cited by examiner

*Primary Examiner* — Lam T Mai
(74) *Attorney, Agent, or Firm* — Winston Hsu; Scott Margo (57) ABSTRACT

A digital to analog converting system, which comprises: a first data converting circuit, for receiving a first digital data stream transmitted at a first clock frequency, for converting the first digital data stream to a plurality of second digital data streams transmitted at a second clock frequency, and for outputting the second digital data streams in parallel; a second data converting circuit, for receiving the second digital data streams from the first data converting circuit, and for converting the second digital data streams to a third digital data stream transmitted at a third clock frequency; and a first digital to analog converter, for converting the third digital data stream to a first output analog data stream. The second clock frequency is lower than the first clock frequency and the third clock frequency.

17 Claims, 7 Drawing Sheets

DIGITAL TO ANALOG CONVERTING SYSTEM AND DIGITAL TO ANALOG CONVERTING METHOD

CROSS REFERENCE TO RELATED APPLICATIONS

This application claims the benefit of U.S. Provisional Application No. 61/901,385, filed on Nov. 7, 2013, the contents of which are incorporated herein by reference.

BACKGROUND

For a transmitter in a communication system, a DAC (digital to analog converter) with a filter is always required. For different communication systems, a DAC may operate at different sampling rates and the filter may need different corners. In a wide-band system, the DAC may operate at a high sampling rate. However, the high-speed interface for transmitting data to the DAC cannot be precisely predicted. Also, the speed of the interface may be limited due to the loading and the DAC cannot reach the high-speed sampling rate.

SUMMARY

Therefore, one objective of the present application is to provide a digital to analog converting system that can avoid the problem for transmitting data at a high clock frequency.

Another objective of the present application is to provide a digital to analog converting method that can avoid the problem for transmitting data at a high clock frequency.

One embodiment of the present application discloses a digital to analog converting system, which comprises: a first data converting circuit, for receiving a first digital data stream transmitted at a first clock frequency, for converting the first digital data stream to a plurality of second digital data streams transmitted at a second clock frequency, and for outputting the second digital data streams in parallel; a second data converting circuit, for receiving the second digital data streams from the first data converting circuit, and for converting the second digital data streams to a third digital data stream transmitted at a third clock frequency; and a first digital to analog converter, for converting the third digital data stream to a first output analog data stream. The second clock frequency is lower than the first clock frequency and the third clock frequency.

Another embodiment of the present application discloses a digital to analog converting method, which comprises: converting a first digital data stream transmitted at a first clock frequency to a plurality of second digital data streams transmitted at a second clock frequency; outputting the second digital data streams in parallel; converting the second digital data streams to a third digital data stream transmitted at a third clock frequency; and converting the third digital data stream to a first output analog data stream via a first digital to analog converter. The second clock frequency is lower than the first clock frequency and the third clock frequency.

In view of above-mentioned embodiments, the data can be transmitted at a lower clock frequency before transmitted to the DAC. Therefore, the above-mentioned issue for the data transmitted at a high clock frequency can be avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
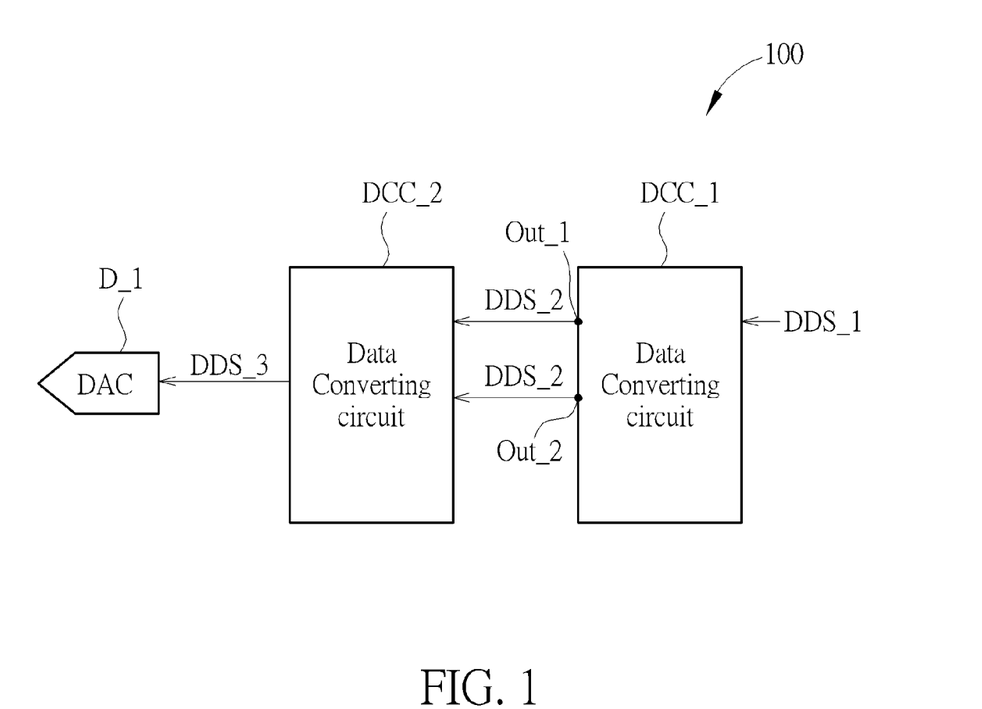
FIG. 1 is a block diagram illustrating a digital to analog converting system according to one embodiment of the present application.

FIG. 1 is a block diagram illustrating a digital to analog converting system according to one embodiment of the present application. In one embodiment, the digital to analog converting system is applied to a multi-communication system, which can transmit or sample data streams at different frequencies. However, the digital to analog converting system disclosed in the present application is not limited to be applied to such multi-communication system. As shown in FIG. 1, the digital to analog converting system 100 comprises: a first data converting circuit DCC_1, a second data converting circuit DCC_2, and a first DAC (digital to analog converter) D_1. The first data converting circuit DCC_1 receives a first digital data stream DDS_1 transmitted at a first clock frequency, converts the first digital data stream DDS_1 to a plurality of second digital data streams DDS_2 transmitted at a second clock frequency, and outputs the second digital data streams in parallel. For example, in one embodiment the first data converting circuit DCC_1 comprises a first output terminal Out_1 and a second output terminal Out_2 for outputting the second digital data streams DDS_2. The first data converting circuit DCC_1 receives the first digital data stream DDS_1 and outputs the second digital data streams DDS_2 at the first output terminal Out_1 and the second output terminal Out_2. That is, the first data converting circuit DCC_1 generates second data streams DDS_2 at two transmitting paths in parallel while receiving the first data stream DDS_1 at a single transmitting path. However, the first data stream DDS_1 at one transmitting path is not limited to be converted to the second data streams DDS_2 transmitted at two transmitting paths, it can be converted to the second data streams DDS_2 transmitted other numbers of transmitting paths. Please note, the second clock frequency is lower than the first clock frequency. In one embodiment, the first clock frequency is 960 MHz and the second clock frequency is 480 MHz. By this way, the transmitting clock frequency for the data stream transmitted to the DAC can be reduced.

The second data converting circuit DCC_2 receives the second digital data streams DDS_2 from the first data converting circuit DCC_1, and converts the second digital data streams DDS_2 to a third digital data stream DDS_3 transmitted at a third clock frequency. The second clock frequency is lower than the third clock frequency. In one embodiment, the third clock frequency is the same as the first clock frequency (i.e. 960 MHz). The second data converting circuit DCC_2 transmits the third digital data stream DDS_3 to a first DAC D_1 for the following process. In one embodiment, the first data converting circuit DCC_1 is from a baseband processor.

Figure 2:
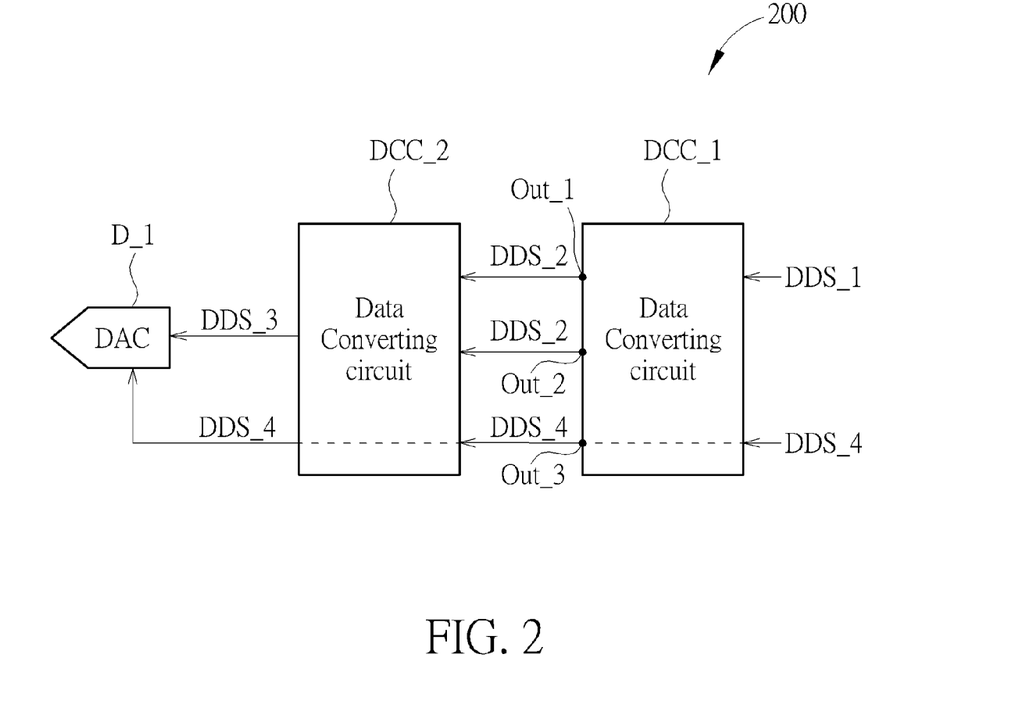
FIG. 2 is a block diagram illustrating a digital to analog converting system according to another embodiment of the present application.

FIG. 2 is a block diagram illustrating a digital to analog converting system 200 according to another embodiment of the present application. In this embodiment, the first data converting circuit DCC_1 further receives a fourth digital data stream DDS_4 transmitted at a fourth clock frequency and bypasses the fourth digital data stream DDS_4 to the second data converting circuit DCC_2. The fourth clock frequency is lower than the first clock frequency. For example, the first clock frequency is 960 MHz and the fourth clock frequency is 48 MHz. The second data converting circuit DCC_2 bypasses the fourth digital data stream DDS_4 as well, to the first DAC D_1. In this embodiment, the digital to analog converting system 200 can operate in two modes: a first mode and a second mode. In the first mode, the first data converting circuit DCC_1 receives the first digital data stream DDS_1, generates the second digital data streams DDS_2, and the second data converting circuit DCC_2 receives the second digital data streams DDS_2, generates the third digital data stream DSS_3. In the second mode, the first data converting circuit DCC_1 and the second data converting circuit DCC_2 both bypass the fourth digital data stream DDS_4. Please note the circuit structure is not limited to which illustrated in FIG. 2. For example, the fourth digital data stream DDS_4 can be transmitted via one of the transmitting paths for transmitting the second digital data streams DDS_2. Additionally, the second data converting circuit DCC_2 can transmit the third digital data stream DDS_3 and the fourth digital data stream DDS_4 via the same path. Further, in one embodiment, the output of the first DAC in FIG. 1 and FIG. 2 can be coupled to a filtering module (not illustrated).

In view of the above-mentioned embodiments illustrated in FIG. 1 and FIG. 2, the digital to analog converting system according to the embodiments of the present application decreases the frequency of the input data stream originally transmitted at high frequency (ex. the first digital data stream DDS_1) to generate frequency-decreased data streams transmitted in parallel (ex. the second digital data stream DDS_2). Furthermore, the frequency of the frequency-decreased data streams is boosted and the frequency-decreased data streams are merged before transmitted to the DAC (ex. the third digital data stream DDS_3). Additionally, the digital to analog converting system according to the embodiments of the present application bypasses the input data stream transmitted at low frequency (ex. the fourth digital data stream DDS_4) to the DAC. By this way, the data stream originally transmitted at high frequency can be frequency-decreased while transmitting from the data source to the DAC, thus the above-mentioned issue while transmitting at high speed can be avoided.

Figure 3:
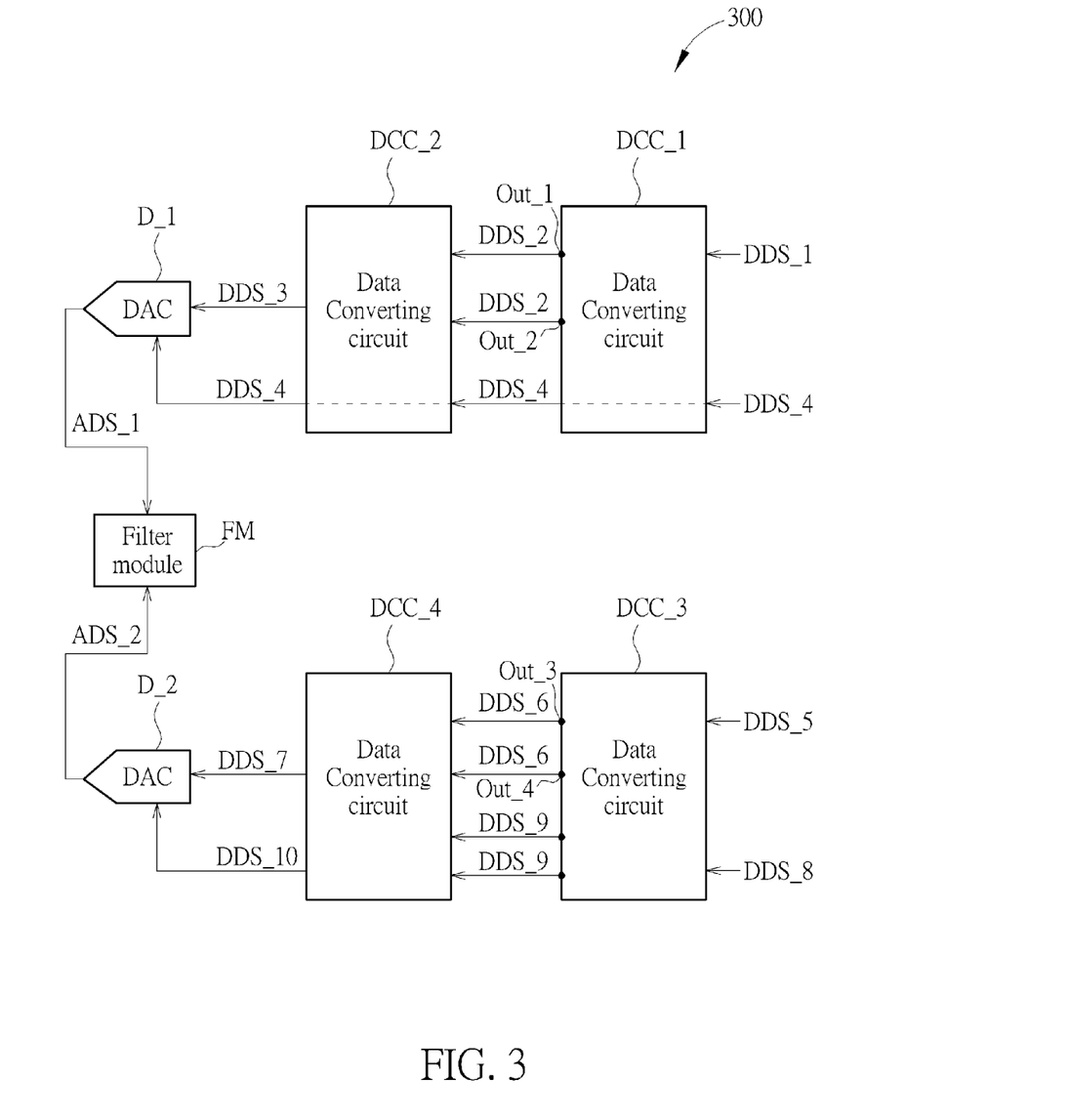
FIG. 3 is a block diagram illustrating a digital to analog converting system according to still another embodiment of the present application.

FIG. 3 is a block diagram illustrating a digital to analog converting system according to still another embodiment of the present application. As shown in FIG. 3, besides the first data converting circuit DCC_1, the second data converting circuit DCC_2, and the first DAC D_1, the digital to analog converting system 300 further comprises a third data converting circuit DCC_3, a fourth data converting circuit DCC_4 and a second DAC D_2. The third data converting circuit DCC_3, the fourth data converting circuit DCC_4 and the second DAC D_2 have a circuit structure the same as which of the embodiment illustrated in FIG. 1, thus is omitted for brevity here.

For more detail, the third data converting circuit DCC_3 receives a fifth digital data stream DDS_5 transmitted at a fifth clock frequency in a first mode, converts the fifth digital data stream DDS_5 to a plurality of sixth digital data streams DDS_6 transmitted at a sixth clock frequency, and outputs the sixth digital data streams in parallel, at a third output terminal Out_3 and a fourth output terminal Out_4. The fourth data converting circuit DCC_4 receives the sixth digital data streams DDS_6 from the third data converting circuit DCC_3, and converts the sixth digital data streams DDS_6 to a seventh digital data stream DDS_7 transmitted at a seventh clock frequency. The second DAC D_2 converts the seventh digital data stream DDS_7 to a second output analog data stream ADS_2. The sixth clock frequency is lower than the fifth clock frequency and the seventh clock frequency. The first output analog data stream ADS_1 and the second output analog data stream ADS_2 are both transmitted to a filter module FM (not limited).

The third data converting circuit DCC_3 can further receive an eighth digital data stream DDS_8 transmitted at an eighth clock frequency in a second mode, converts the eighth digital data stream DDS_8 to a plurality of ninth digital data streams DDS_9 transmitted at a ninth clock frequency, and outputs the ninth digital data streams DDS_9 in parallel. The fourth data converting circuit DCC_4 receives the ninth digital data streams DDS_9 from the third data converting circuit DCC_3, and converts the ninth digital data streams DDS_9 to a tenth digital data stream DDS_10 transmitted at a tenth clock frequency. The second DAC D_2 converts the tenth digital data stream DDS_10 to the second output analog data stream ADS_2. The ninth clock frequency is lower than the eighth clock frequency and the tenth clock frequency.

Please note the third data converting circuit DCC_3 and the fourth data converting circuit DCC_4 can operate independently, that is, a digital to analog converting system according to an embodiment of the present application can comprise the third data converting circuit DCC_3, the fourth data converting circuit DCC_4 and the second DAC D_2 without comprising the first data converting circuit DCC_1, the second data converting circuit DCC_2, the first DAC D_1, and the filter module FM.

In view of the embodiment shown in FIG. 3, it can be understood that the digital to analog converting system provided by the present application is not limited to comprise a single DAC. Additionally, it can be understood the embodiments illustrated in FIG. 1 and FIG. 2, can be combined to form a digital to analog converting system with any arrangement.

Figure 4:
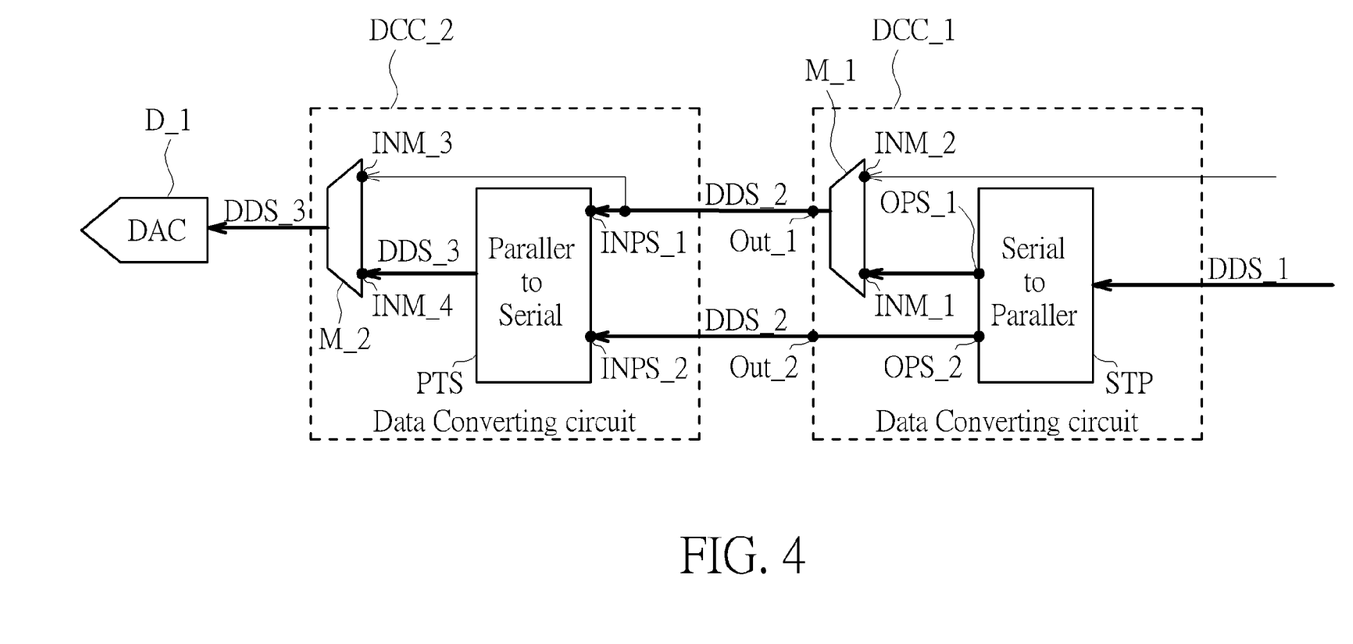
FIG. 4 and FIG. 5 are circuit diagrams illustrating the detail circuits for the first data converting circuit and the second data converting circuit shown in FIG. 1.
Figure 5:
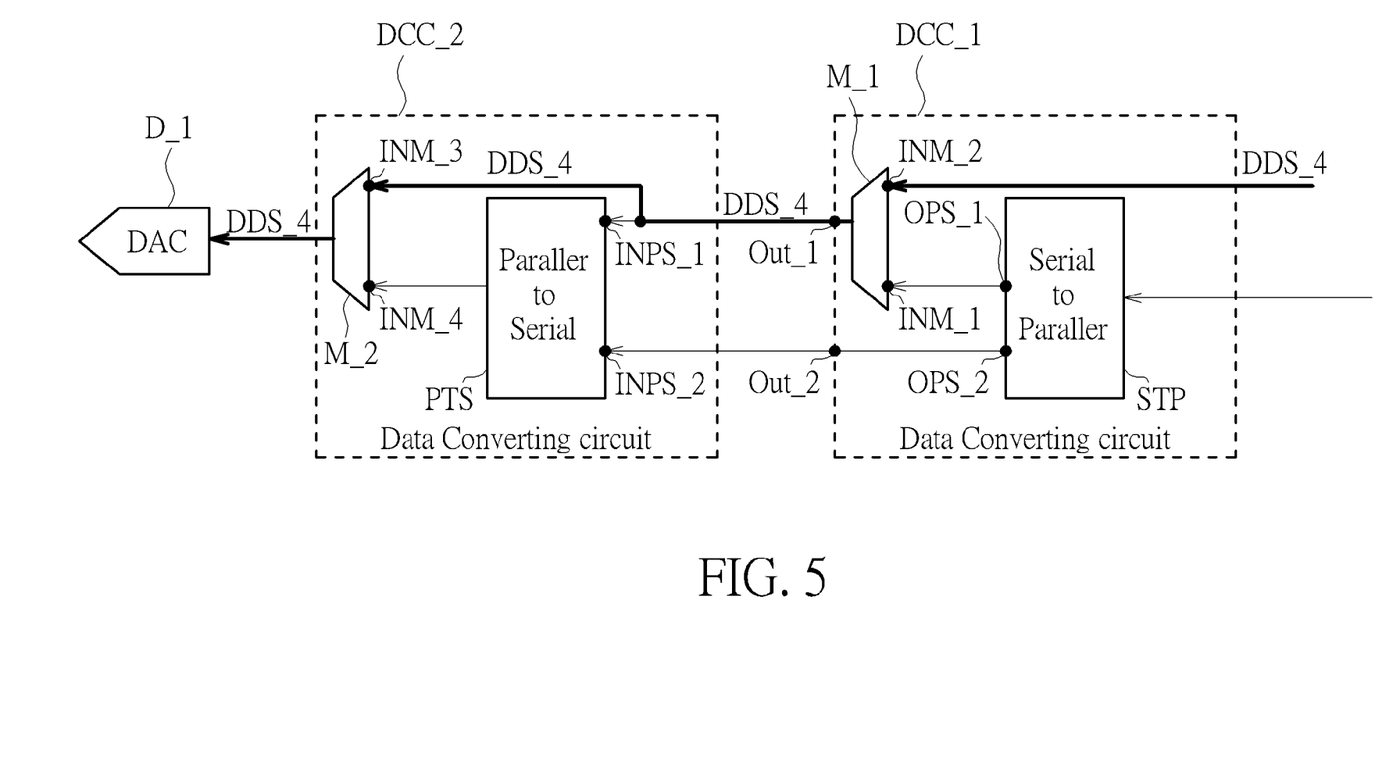

FIG. 4 and FIG. 5 are circuit diagrams illustrating the detail circuits for the first data converting circuit and the second data converting circuit shown in FIG. 1. Please note the circuit structures illustrated in FIG. 4 and FIG. 5 are the same, but the circuit in FIG. 4 operates in the first mode, the circuit in FIG. 5 operates in the second mode. Please refer to FIG. 4, the first data converting circuit DDC_1 comprises: a first output terminal Out_1, a second output terminal Out_2, a serial to parallel converter STP, and a first multiplexer M_1. The serial to parallel converter STP comprises a plurality of serial to parallel output terminals (a first serial to parallel OSP_1 and a second serial to parallel OSP_2 in this example), converts the first digital data stream DDS_1 to output the second digital data streams DDS_2 at the serial to parallel output terminals, in parallel. The first multiplexer M_1 comprises a first multiplexer input terminal INM_1 coupled to one of the serial to parallel output terminals (the first serial to parallel output terminal OSP_1 in this example), a second multiplexer input terminal INM_2 for receiving the fourth digital data stream. The first multiplexer M_1 outputs the second digital data stream DDS_2 to the first output terminal Out_1 in the first mode and outputs the fourth digital data stream to the first output terminal Out_1 in the second mode.

The second data converting circuit DDC_2 comprises a parallel to serial converter PTS and a second multiplexer M_2. The parallel to serial converter PTS comprises a first parallel to serial input terminal INPS_1 coupled to the first output terminal Out_1 and at least one second parallel to serial terminal respectively coupled to the serial to parallel output terminals (in this embodiment, one second parallel to serial terminal INPS_2 is provided), and converts the second data streams DDS_2 to the third digital data stream DDS_3.

The second multiplexer M_2 comprises a third multiplexer input terminal INM_3 coupled to the first output terminal Out_1 and a fourth multiplexer input terminal INM_4 coupled to the parallel to serial converter PTS. The second multiplexer M_2 outputs the third digital data stream DDS_3 to the first DAC D_1 in the first mode and outputs the fourth digital data stream to the first DAC D_1 in the second mode.

As described above, the circuit in FIG. 4 operates in the first mode, and the circuit in FIG. 5 operates in the second mode. Therefore, the first multiplexer M_1 outputs the second digital data streams DDS_2, and the second multiplexer M_2 outputs the third digital data streams DDS_3 in FIG. 4. On the contrary, the first multiplexer M_1 outputs the fourth digital data streams DDS_4, and the second multiplexer M_2 outputs the fourth digital data streams DDS_4 in FIG. 5. The data transmitting paths for different modes are respectively marked by bold lines in FIG. 4 and FIG. 5, thus the description thereof is omitted for brevity here.

Figure 6:
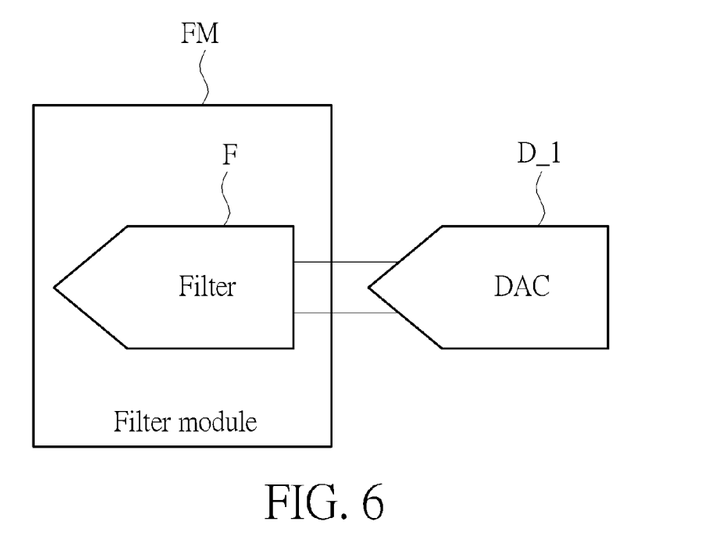
FIG. 6 and FIG. 7 are circuit diagrams illustrating the filter module in the digital to analog converting system according to one embodiment of the present application.
Figure 7:
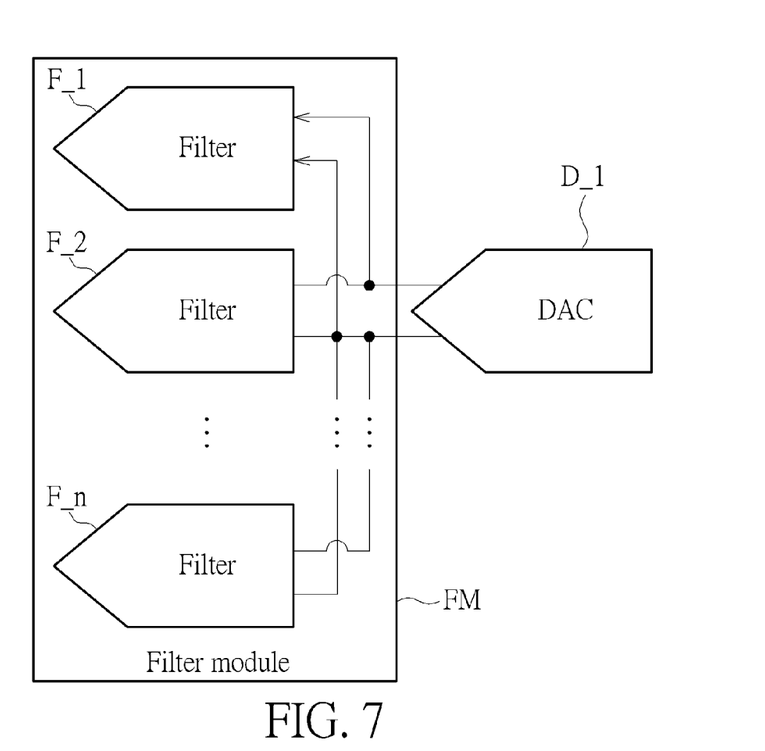

FIG. 6 and FIG. 7 are circuit diagrams illustrating the filter module FM, which is coupled to an output of above mentioned first DAC or second DAC, in the digital to analog converting system according to embodiments of the present application. As shown in FIG. 6, the filter module FM can comprise only one filter F. Alternatively, the filter module FM can comprise filters F_1, F_2 . . . F_n, which can respectively couples to different systems. Also, in one embodiment, the filters are programmable filters, such that the corner for the filters can be controlled by different instructions, to meet requirements for different systems.

Figure 8:
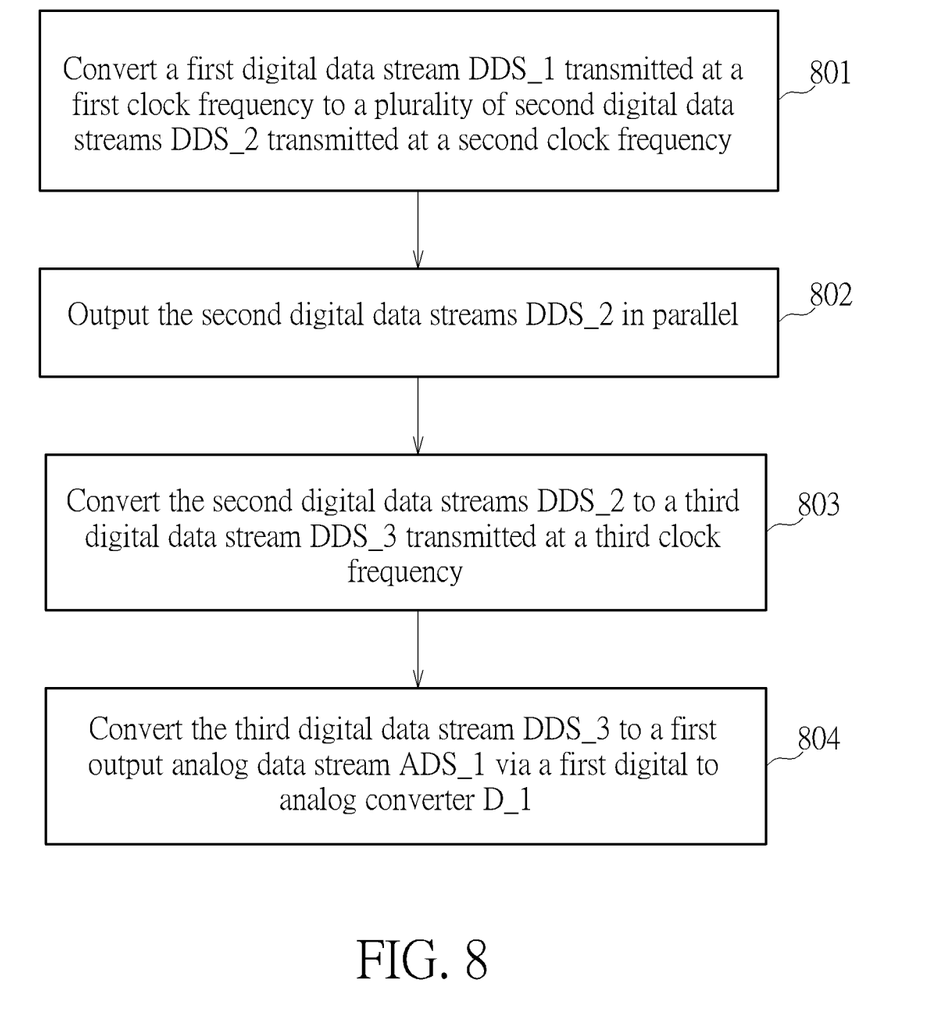
FIG. 8 is a flow chart illustrating the steps for a digital to analog converting method according to one embodiment of the present application.

In view of above-mentioned embodiments, a digital to analog converting method can be acquired, as shown in FIG. 8. FIG. 8 comprises the following steps:

Step 801

Convert a first digital data stream DDS_1 transmitted at a first clock frequency to a plurality of second digital data streams DDS_2 transmitted at a second clock frequency. The second clock frequency is lower than the first clock frequency.

Step 802

Output the second digital data streams DDS_2 in parallel.

Step 803

Convert the second digital data streams DDS_2 to a third digital data stream DDS_3 transmitted at a third clock frequency. The second clock frequency is lower than the third clock frequency.

Step 804

Convert the third digital data stream DDS_3 to a first output analog data stream ADS_1 via a first DAC D_1.

Other detail steps can be acquired based on above-mentioned embodiments, thus are omitted for brevity here.

In view of above-mentioned embodiments, the data can be transmitted at a lower clock frequency before transmitted to the DAC. Therefore, the above-mentioned issue for the data transmitted at a high clock frequency can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital to analog converting system, comprising:
   a first data converting circuit, for receiving a first digital data stream transmitted at a first clock frequency, for converting the first digital data stream to a plurality of second digital data streams transmitted at a second clock frequency, and for outputting the second digital data streams in parallel;
   a second data converting circuit, for receiving the second digital data streams from the first data converting circuit, and for converting the second digital data streams to a third digital data stream transmitted at a third clock frequency; and
   a first digital to analog converter, for converting the third digital data stream to a first output analog data stream;
   wherein the second clock frequency is lower than the first clock frequency and the third clock frequency.

2. The digital to analog converting circuit of claim 1, wherein the first clock frequency and the third clock frequency are the same.

3. The digital to analog converting circuit of claim 1,
   wherein the first data converting circuit receives the first digital data stream to generate the second data streams in a first mode, and bypasses a fourth digital data stream transmitted at a fourth clock frequency in a second mode;
   wherein the second data converting circuit generates the third digital data stream in the first mode and bypasses the fourth digital data stream in the second mode;
   wherein the first digital to analog converter receives the third digital data stream and operates at a first sampling rate in the first mode, receives the fourth digital data stream and operates at a second sampling rate in the second mode.

4. The digital to analog converting circuit of claim 3, wherein the digital to analog converting circuit is applied to a multi-communication system.

5. The digital to analog converting circuit of claim 3, wherein the fourth clock frequency is lower than the first clock frequency.

6. The digital to analog converting circuit of claim 3, wherein the first data converting circuit comprises:
   a first output terminal;
   a second output terminal;
   a serial to parallel converter, comprising a plurality of serial to parallel output terminals, for converting the first digital data stream to output the second digital data streams at the serial to parallel output terminals, in parallel; and
   a first multiplexer, comprising a first multiplexer input terminal coupled to one of the serial to parallel output terminals, a second multiplexer input terminal for receiving the fourth digital data stream, for outputting the second digital data stream to the first output terminal in the first mode and for outputting the fourth digital data stream to the first output terminal in the second mode;
   wherein the second data converting circuit comprises;
   a parallel to serial converter, comprising a first parallel to serial input terminal coupled to the first output terminal and at least one second parallel to serial terminal respectively coupled to the serial to parallel output terminals, and for converting the second data streams to the third digital data stream; and
   a second multiplexer, comprising a third multiplexer input terminal coupled to the first output terminal and a fourth multiplexer input terminal coupled to the parallel to serial converter, for outputting the third digital data stream to the first digital to analog converter in the first mode and for outputting the fourth digital data stream to the first digital to analog converter in the second mode.

7. The digital to analog converting circuit of claim 1,
wherein the first data converting circuit further receives an eighth digital data stream transmitted at an eighth clock frequency, for converting the eighth digital data stream to a plurality of ninth digital data streams transmitted at a ninth clock frequency, and for outputting the ninth digital data streams in parallel;
wherein the second data converting circuit further receives the ninth digital data streams from the first data converting circuit, and converts the ninth digital data streams to a tenth digital data stream transmitted at a tenth clock frequency;
wherein first digital to analog converter converts the tenth digital data stream to the first output analog data stream;
wherein the ninth clock frequency is lower than the eighth clock frequency and the tenth clock frequency.

8. The digital to analog converting circuit of claim 1, further comprising:
a filter module, comprising at least one filter, for receiving the first output analog data stream to generate a filtered analog data stream.

9. The digital to analog converting circuit of claim 8, wherein the digital to analog converting circuit is applied to a multi-communication system.

10. The digital to analog converting circuit of claim 8, wherein the filters are programmable filters.

11. The digital to analog converting circuit of claim 1, further comprising:
a third data converting circuit, comprising a third output terminal and a fourth output terminal, for receiving a fifth digital data stream transmitted at a fifth clock frequency, for converting the fifth digital data stream to a plurality of sixth digital data streams transmitted at a sixth clock frequency, and for simultaneously outputting the sixth digital data streams at the third output terminal and the fourth output terminal;
a fourth data converting circuit, for receiving the sixth digital data streams from the third data converting circuit, and for converting the sixth digital data streams to a seventh digital data stream transmitted at a seventh clock frequency; and
a second digital to analog converter, for converting the seventh digital data stream to a second output analog data stream;
wherein the sixth clock frequency is lower than the fifth clock frequency and the seventh clock frequency.

12. A digital to analog converting method, comprising:
converting a first digital data stream transmitted at a first clock frequency to a plurality of second digital data streams transmitted at a second clock frequency;
outputting the second digital data streams in parallel;
converting the second digital data streams to a third digital data stream transmitted at a third clock frequency; and
converting the third digital data stream to a first output analog data stream via a first digital to analog converter;
wherein the second clock frequency is lower than the first clock frequency and the third clock frequency.

13. The digital to analog converting method of claim 12, wherein the first clock frequency and the third clock frequency are the same.

14. The digital to analog converting method of claim 12, comprising:
generating the second data streams and the third digital data stream, and outputting the third digital data stream to the first digital to analog converter in a first mode;
receiving a fourth digital data stream and transmitting the fourth digital data stream to the first output analog data stream in a second mode;
operating the first digital to analog converter at the third clock frequency in the first mode, and operating the first digital to analog converter at the fourth clock frequency in the second mode.

15. The digital to analog converting method of claim 14, wherein the digital to analog converting circuit is applied to a multi-communication system.

16. The digital to analog converting method of claim 14, wherein the fourth clock frequency is lower than the first clock frequency.

17. The digital to analog converting method of claim 12, further comprising:
converting an eighth digital data stream transmitted at an eighth clock frequency to a plurality of ninth digital data streams transmitted at a ninth clock frequency;
outputting the ninth digital data streams in parallel;
converting the ninth digital data streams to a tenth digital data stream transmitted at a tenth clock frequency; and
converting the tenth digital data stream to the first output analog data stream via the first digital to analog converter;
wherein the ninth clock frequency is lower than the eighth clock frequency and the tenth clock frequency.

* * * * *